(12) United States Patent
Chang et al.

(10) Patent No.: US 11,888,049 B2
(45) Date of Patent: Jan. 30, 2024

(54) DIELECTRIC ISOLATION STRUCTURE FOR MULTI-GATE TRANSISTORS

(71) Applicant: Taiwan Semiconductor Manufacturing Company, Ltd., Hsinchu (TW)

(72) Inventors: Jen-Hong Chang, Hsinchu (TW); Yuan-Ching Peng, Hsinchu (TW); Chung-Ting Ko, Kaohsiung (TW); Kuo-Yi Chao, Hsinchu (TW); Chia-Cheng Chao, Hsinchu (TW); You-Ting Lin, Miaoli County (TW); Chih-Chung Chang, Nantou County (TW); Yi-Hsiu Liu, Hsinchu (TW); Jiun-Ming Kuo, Taipei (TW); Sung-En Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/077,714

(22) Filed: Dec. 8, 2022

(65) Prior Publication Data
US 2023/0098409 A1    Mar. 30, 2023

Related U.S. Application Data

(62) Division of application No. 17/359,105, filed on Jun. 25, 2021, now Pat. No. 11,532,733.

(51) Int. Cl.
*H01L 29/76* (2006.01)
*H01L 29/94* (2006.01)
(Continued)

(52) U.S. Cl.
CPC ............. *H01L 29/66795* (2013.01); *H01L 21/823431* (2013.01); *H01L 21/823481* (2013.01); *H01L 29/0649* (2013.01); *H01L 29/7851* (2013.01)

(58) Field of Classification Search
CPC ....... H01L 29/66795; H01L 21/823431; H01L 21/823481; H01L 29/0649; H01L 29/7851;
(Continued)

(56) References Cited

U.S. PATENT DOCUMENTS 9,484,447 B2 * 11/2016 Kim .................. H01L 21/30604
9,818,872 B2    11/2017 Ching
(Continued)

*Primary Examiner* — Theresa T Doan
(74) *Attorney, Agent, or Firm* — HAYNES AND BOONE, LLP

(57) ABSTRACT

Semiconductor structures and methods of forming the same are provided. A method according to the present disclosure includes forming a stack of epitaxial layers over a substrate, forming a first fin-like structure and a second fin-like structure from the stack, forming an isolation feature between the first fin-like structure and the second fin-like structure, forming a cladding layer over the first fin-like structure and the second fin-like structure, conformally depositing a first dielectric layer over the cladding layer, depositing a second dielectric layer over the first dielectric layer, planarizing the first dielectric layer and the second dielectric layer until the cladding layer are exposed, performing an etch process to etch the second dielectric layer to form a helmet recess, performing a trimming process to trim the first dielectric layer to widen the helmet recess, and depositing a helmet feature in the widened helmet recess.

20 Claims, 18 Drawing Sheets

(51) Int. Cl.
  *H01L 31/062*      (2012.01)
  *H01L 29/66*       (2006.01)
  *H01L 21/8234*     (2006.01)
  *H01L 29/06*       (2006.01)
  *H01L 29/78*       (2006.01)

(58) Field of Classification Search
  CPC ............. H01L 29/42392; H01L 29/165; H01L 29/7848; H01L 29/0673; H01L 29/66439; H01L 29/66545; H01L 29/775; H01L 29/78696; H01L 21/823437; H01L 27/088; H01L 29/1079; H01L 29/41791; H01L 29/785
  USPC ....................................................... 257/288
  See application file for complete search history.

(56) References Cited

U.S. PATENT DOCUMENTS

| | | |
|---|---|---|
| 9,887,269 B2 | 2/2018 | Ching |
| 9,899,398 B1 | 2/2018 | Colinge |
| 10,032,627 B2 | 7/2018 | Lee |
| 10,074,575 B1 | 9/2018 | Guillorn |
| 10,109,721 B2 | 10/2018 | Chun-Hsiung |
| 10,147,787 B1 * | 12/2018 | Wang .................. H01L 29/7851 |
| 10,157,799 B2 | 12/2018 | Ching |
| 10,199,502 B2 | 2/2019 | Huang |
| 10,290,546 B2 | 5/2019 | Chiang |
| 10,475,902 B2 | 11/2019 | Ying |
| 11,271,083 B2 | 3/2022 | Cheng |
| 2017/0278928 A1 | 9/2017 | Tung |
| 2018/0175036 A1 | 6/2018 | Ching |

* cited by examiner

DIELECTRIC ISOLATION STRUCTURE FOR MULTI-GATE TRANSISTORS

PRIORITY DATA

This application is a divisional application of U.S. patent application Ser. No. 17/359,105, filed Jun. 25, 2021, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Dielectric isolation structures are used to isolate IC device features that would otherwise come in contact with one another. For example, dielectric fins are used to isolate source/drain features that are epitaxially grown from channel members of multi-gate devices, such as MBC transistors. Without dielectric fins, adjacent source/drain features may merge, resulting in undesirable electrical connections. While existing dielectric isolation structures are adequate for their intended purposes, they are not satisfactory for all purposes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
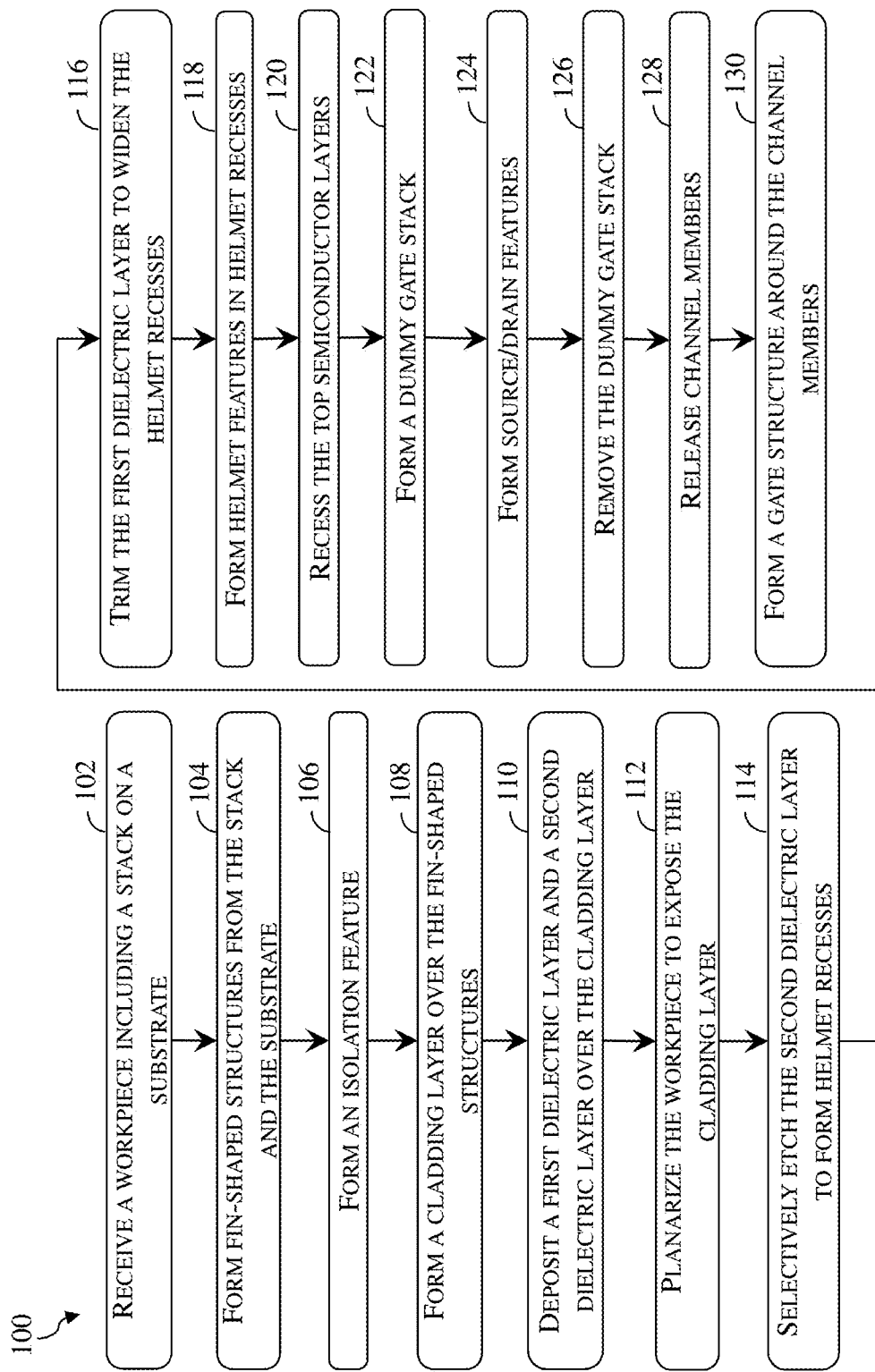
FIG. 1 illustrates a flowchart of a method for forming a semiconductor structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to dielectric isolation structures and more particularly to dielectric isolation structures between adjacent source/drain features.

Dielectric fins or hybrid fins are implemented in fabrication of MBC transistors to serve several functions. During source/drain feature formation, they function to prevent epitaxial growth from merging with one another, causing undesirable shorts. After gate formation, they may serve as a gate cut feature or a part of a gate cut feature to separate a gate structure into multiple segments. In some instances, a dielectric fin includes a base feature and a helmet feature over the base feature. Compared to the helmet feature, the base feature has a lower dielectric constant than the helmet feature to reduce undesirable parasitic capacitance between adjacent gate structures. The helmet feature is more etch-resistant than the base feature and serves as a capping layer of the base feature. The present disclosure provides a dielectric fin with a helmet feature that facilitates source/drain feature patterning and gate formation. In some embodiments, the helmet feature of the present disclosure includes a bottom width and a top width greater than the bottom width. The larger top width of this tapered profile facilitates the source/drain feature patterning and the smaller bottom width creates greater access to the gate trench. Additionally, the present disclosure provides a multi-step process to form the helmet recess. The result is that the helmet feature does not overly extend downwards into the low-k base feature to increase the parasitic capacitance.

The various aspects of the present disclosure will now be described in more detail with reference to the figures. FIG. 1 illustrate a flowchart of a method 100 of forming a semiconductor device. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-17, which illustrate fragmentary cross-sectional views of a workpiece 200 at different stages of fabrication according to embodiments of method 100. Because a semiconductor device or a semiconductor structure will be formed from the workpiece 200, the workpiece 200 may be referred to as a semiconductor device 200 or a semiconductor structure 200 as the context requires. Throughout FIG. 2-17, the X direction, the Y direction, and the Z direction are perpendicular to one another and are used consistently. For example, the X direction in one figure is parallel to the X direction in a different figure. Additionally, throughout the present disclosure, like reference numerals are used to denote like features.

Figure 2:
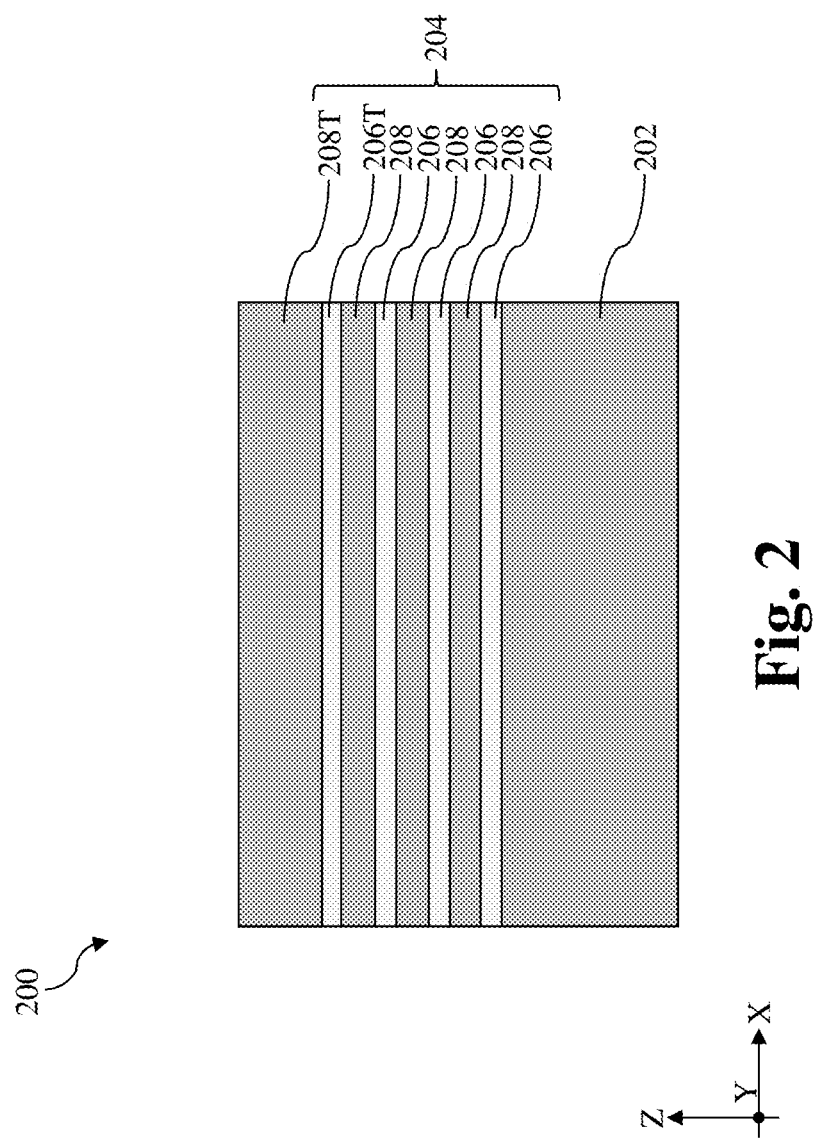
FIGS. 2-17 illustrate fragmentary cross-sectional views of a workpiece during various fabrication stages in the method of FIG. 1, according to one or more aspects of the present disclosure.

Referring to FIGS. 1 and 2, method 100 includes a block 102 where a workpiece 200 is received. As shown in FIG. 2, the workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GeOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

Referring still to FIG. 2, the stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. In the depicted embodiment, the stack 204 may further include a top channel layer 208T and a top sacrificial layer 206T that collectively serve as hard mask to protect the rest of the stack 204 below and may be completely removed in a subsequent process. When the top channel layer 208T and the top sacrificial layer 206T are discounted, the stack 204 shown in FIG. 2 includes three (3) layers of the sacrificial layers 206 and three (3) layers, which is for illustrative purposes only and not intended to be limiting beyond what is specifically recited in the claims. The number of layers in the stack 204 depends on the desired number of channels members for the semiconductor device 200. In some embodiments, the number of the channel layers 208 (the top channel layer 208T excluded) is between 2 and 10.

Figure 3:
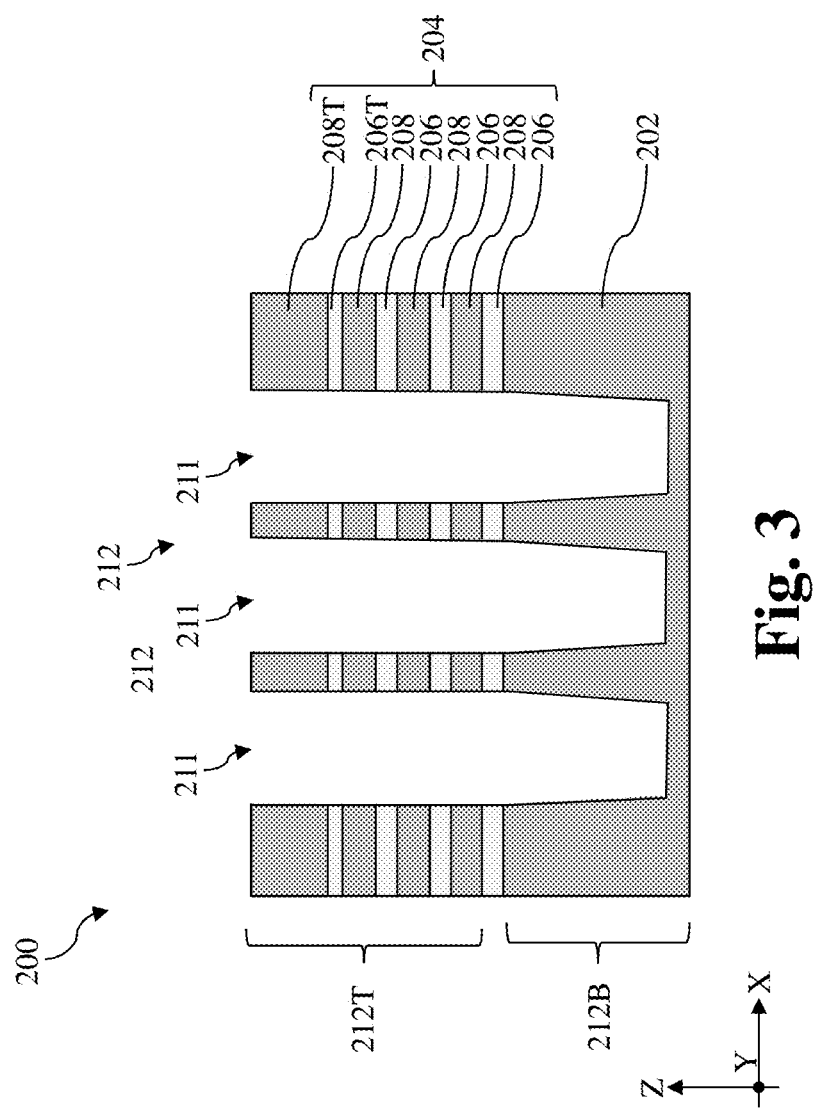
Figure 4:
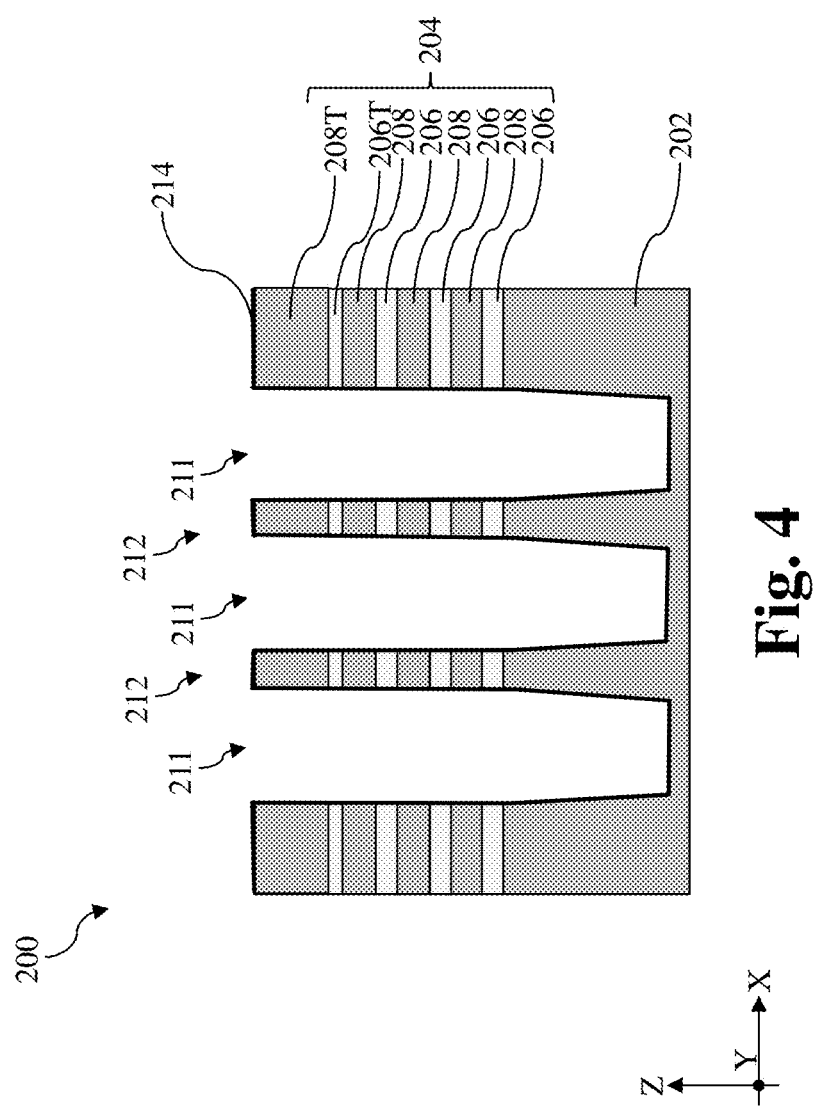

Referring to FIGS. 1, 3 and 4, method 100 includes a block 104 where fin-shaped structure 212 are formed. In some embodiments, at block 104, the stack 204 and a portion of the substrate 202 are patterned to form the fin-shaped structures 212 that are defined by trenches 211. As shown in FIG. 3, each of the fin-shaped structures 212 includes a base portion 212B formed from a portion of the substrate 202 and a top portion 212T formed from the stack 204. The top portion 212T is disposed over the base portion 212B. The fin-shaped structures 212 extend lengthwise along the Y direction and extend vertically along the Z direction from the substrate 202. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a hard mask layer is first deposited over the stack 204 and then a material layer is formed over the hard mask. The material layer is patterned using a photolithography process. Spacers are formed alongside the patterned material layer using a self-aligned process. The material layer is then removed, and the remaining spacers, or mandrels, may then be used to pattern the hard mask layer and then the patterned hard mask layer may be used to pattern the fin-shaped structures 212 by etching the stack 204 and the substrate 202. The etching process can include dry etching, wet etching, reactive ion etching (RIE), and/or other suitable processes. In some embodiments, a semiconductor liner 214 may be deposited over the fin-shaped structure 212, as shown in FIG. 4. The semiconductor liner 214 may include silicon (Si) or silicon-rich silicon germanium (SiGe). In some implementations, the semiconductor liner 214 may be deposited using ALD, PEALD, VPE, MBE, or a suitable method.

Figure 5:
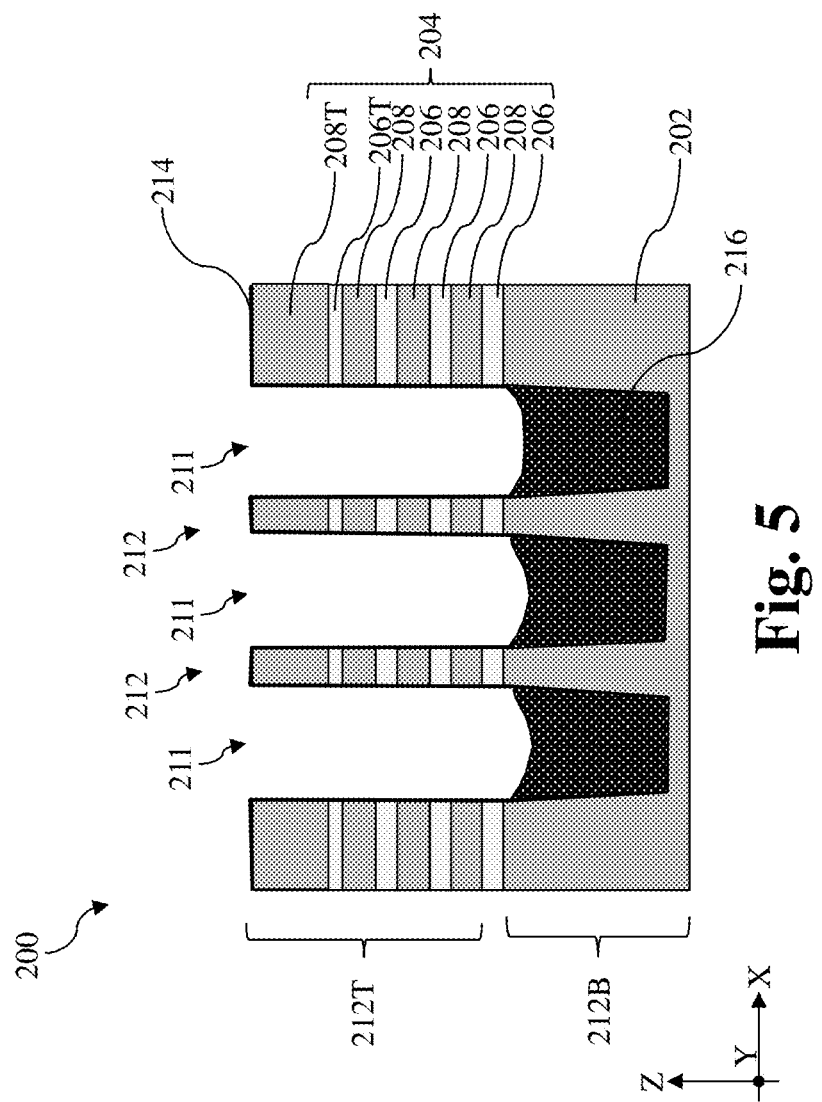

Referring to FIGS. 1 and 5, method 100 includes a block 106 where an isolation feature 216 is formed. After the fin-shaped structures 212 are formed, the isolation feature 216 shown in FIG. 5 is formed between neighboring fin-shaped structures 212. The isolation feature 216 may also be referred to as a shallow trench isolation (STI) feature 216. In an example process, a dielectric material for the isolation feature 216 is first deposited over the semiconductor liner 214 over the workpiece 200, filling the trenches 211 between fin-shaped structures 212 with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a flowable CVD (FCVD) process, spin-on coating, and/or other suitable process. The deposited dielectric material is then thinned and planarized, for example by a chemical mechanical polishing (CMP) process, until at least a portion of the semiconductor liner 214 is exposed. The planarized dielectric material is further recessed by a dry etching process, a wet etching process, and/or a combination thereof to form the isolation feature 216. As shown in FIG. 5, the top portions 212T of the fin-shaped structures 212 rise above the isolation feature 216 while the base portions 212B are surrounded by the isolation feature 216.

Figure 6:
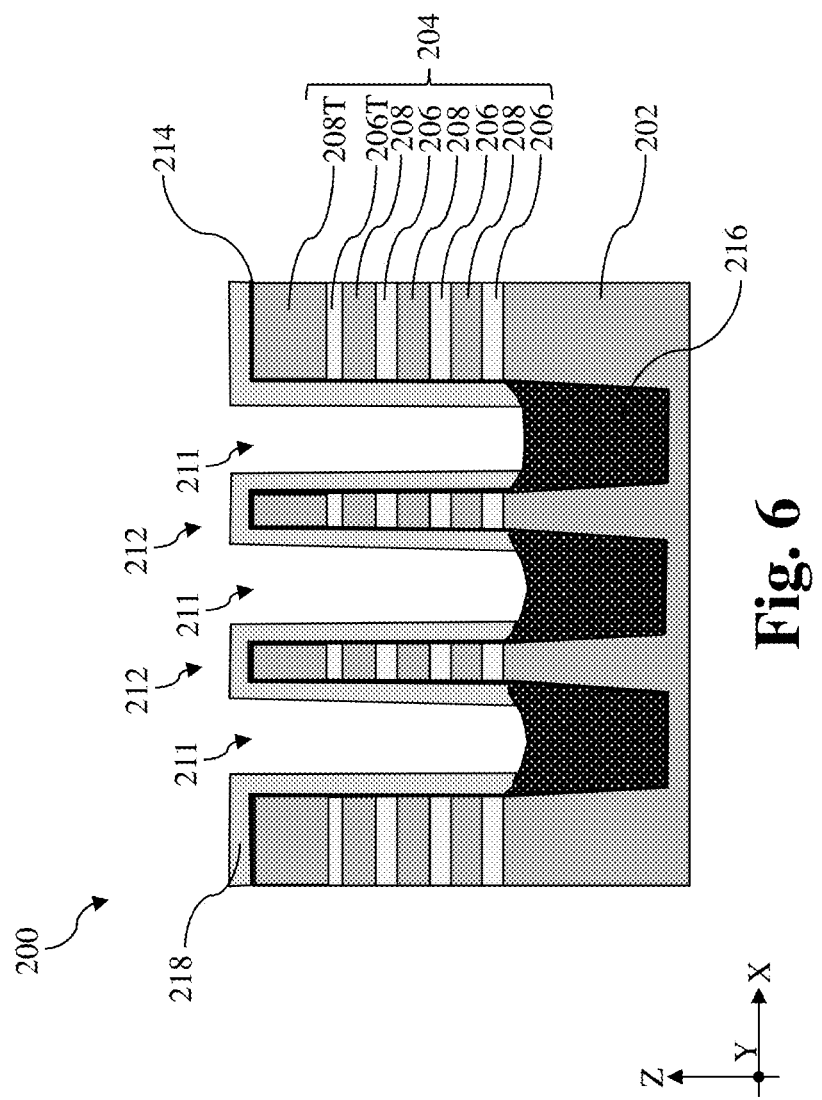

Referring to FIGS. 1 and 6, method 100 includes a block 108 where a cladding layer 218 is formed over the fin-shaped structures 212. In some embodiments, the cladding layer 218 may have a composition similar to that of the sacrificial layers 206. In one example, the cladding layer 218 may be formed of silicon germanium (SiGe). This common composition between the sacrificial layers 206 and the cladding layer 218 allows selective and simultaneous removal of the sacrificial layers 206 and the cladding layer 218 in a subsequent process. In some embodiments, the cladding layer 218 may be conformally and epitaxially grown using vapor phase epitaxy (VPE) or molecular bean epitaxy (MBE). As shown in FIG. 6, the cladding layer 218 is selectively disposed on exposed surfaces of the semiconductor liner 214, but not on the isolation feature 216, which is formed of a dielectric material. In some instances, the cladding layer 218 may have a thickness between about 5 nm and about 10 nm. After the deposition of the cladding layer 218, a portion of the isolation feature 216 is exposed in the trenches 211, now made narrower by the semiconductor liner 214 and the cladding layer 218.

Figure 7:
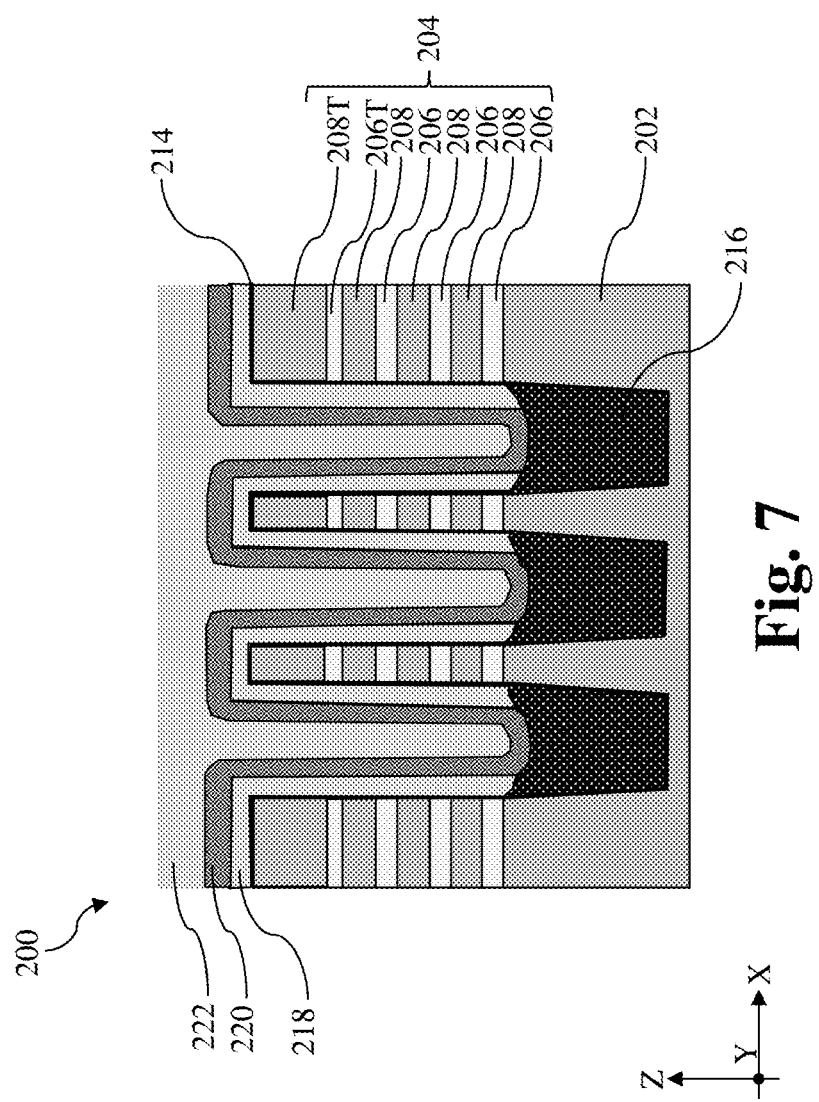

Referring to FIGS. 1 and 7, method 100 includes a block 110 where a first dielectric layer 220 and a second dielectric layer 222 are deposited over the cladding layer, including over the trenches 211. In an example process, the first dielectric layer 220 is conformally deposited over the workpiece 200, including in the trenches 211, as shown in FIG. 7. The first dielectric layer 220 may be deposited using PECVD, ALD, or a suitable method. The first dielectric layer 220 lines the sidewalls and the bottom surfaces of the trenches 211, which is defined by the cladding layer 218 before the operations at block 110. The first dielectric layer 220 may also be referred to as a dielectric liner 220 or an outer layer 220. In some embodiments, the first dielectric layer 220 is formed to a thickness between about 3 nm and about 6 nm, such as between 4 nm and about 5 nm. A second dielectric layer 222 is then deposited over the first dielectric layer 220 on the workpiece 200 using CVD, SACVD, FCVD, ALD, spin-on coating, and/or other suitable process. The second dielectric layer 222 may also be referred to as a dielectric filler 222 or an inner layer 222. The first dielectric layer 220 may include silicon, silicon nitride, silicon carbide, silicon carbonitride, silicon oxycarbonitride, or a suitable dielectric material that can be oxidized. In some instances, the first dielectric layer 220 is free of oxygen. In some other instances, the first dielectric layer 220 is at least not fully oxidized. In the depicted embodiment, the first dielectric layer 220 may include silicon carbonitride. The second dielectric layer 222 may include silicon oxide or other dielectric layers that are fully oxidized or are unlikely to be oxidized by an oxidizer. In the depicted embodiment, the second dielectric layer 222 is formed of silicon oxide.

Figure 8:
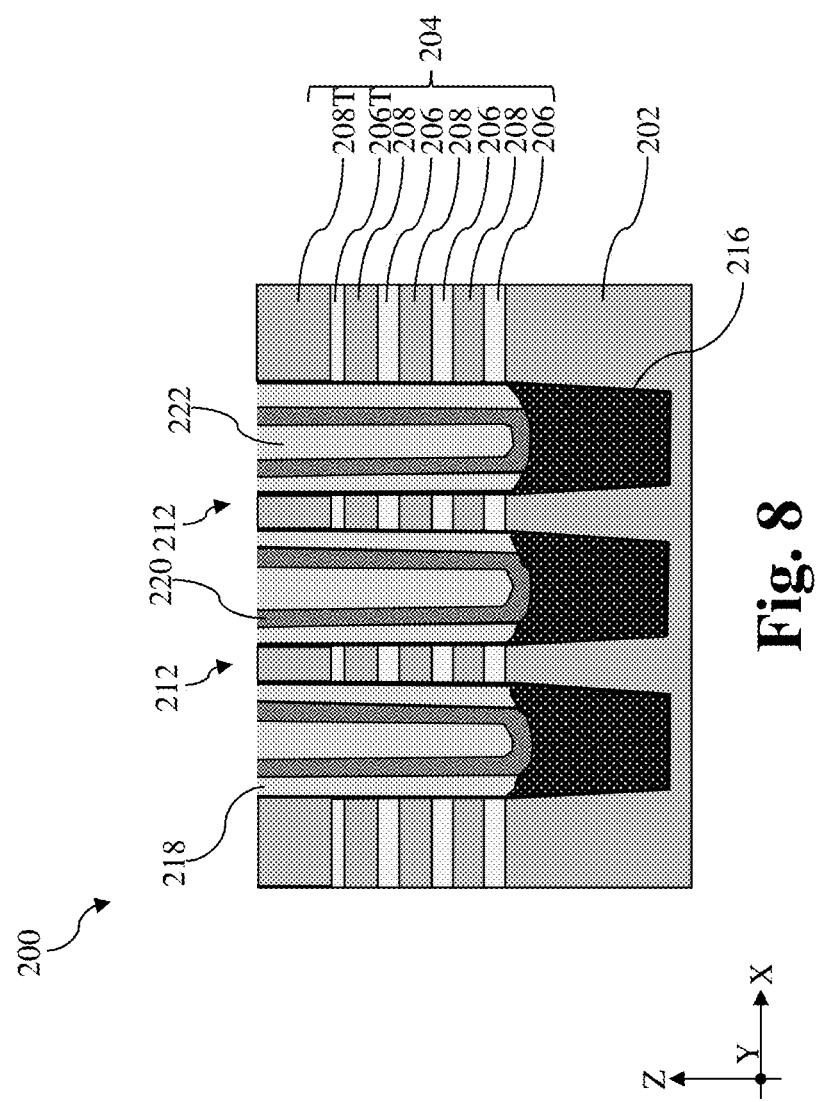

Referring to FIGS. 1 and 8, method 100 includes a block 112 where the workpiece 200 is planarized after the deposition of the first dielectric layer 220 and the second dielectric layer 222. The planarization at block 112 may be performed using a chemical mechanical polishing (CMP) process until the cladding layer 218 is exposed, as shown in FIG. 8. As shown in FIG. 8, top surfaces of the top channel layer 208T, the semiconductor liner 214, the first dielectric layer 220, and the second dielectric layer 222 are coplanar.

Figure 9:
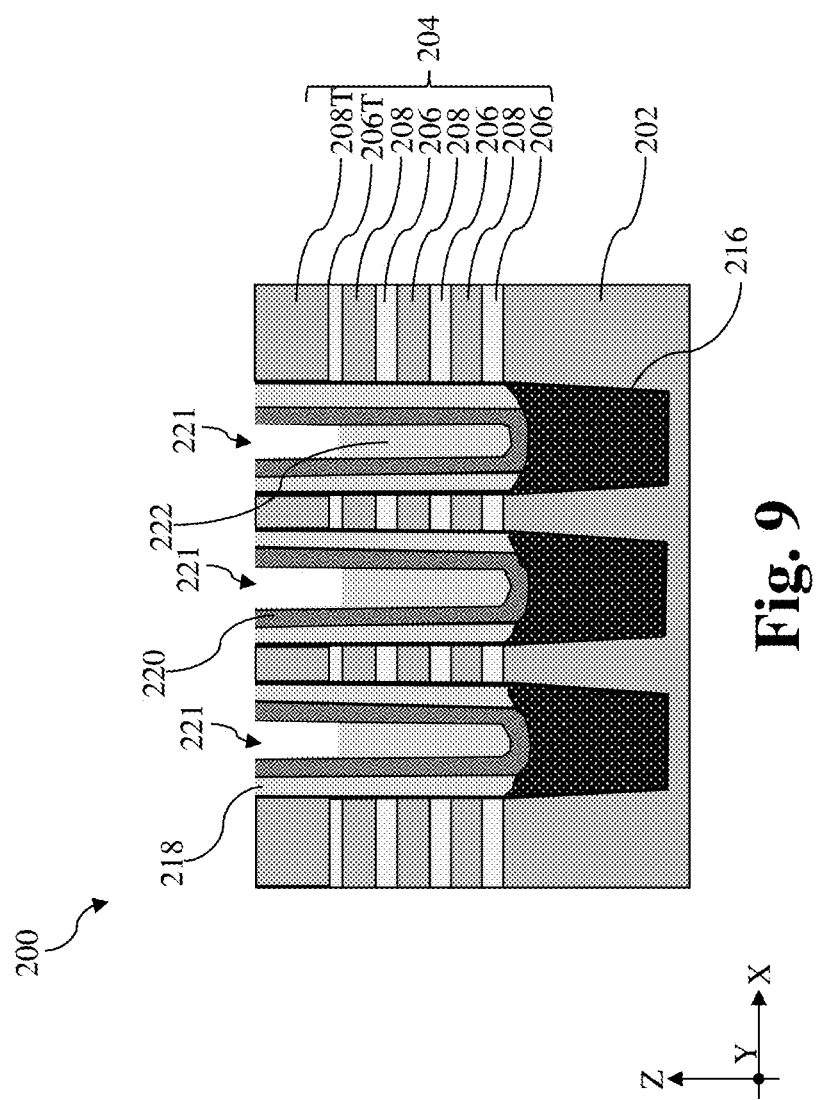

Referring to FIGS. 1 and 9, method 100 includes a block 114 where the second dielectric layer 222 is selectively etched to form helmet recesses 221. The etching process at block 114 is highly selective to the second dielectric layer 222, which is formed of silicon oxide in the depicted embodiment. In some embodiments, the selective etching process at block 114 may be chemical oxide removal process or an atomic layer etch (ALE). For example, the workpiece 200, including the second dielectric layer 222, may be treated with ammonia ($NH_3$) and hydrofluoric acid (HF), one at a time, alternatingly. This chemical treatment may produce ammonium hexafluorosilicate ($(NH_4)_2SiF_6$), which may be removed by an anneal process or a deionized (DI) water washing process. In an example process, the workpiece 200 is treated with multiple cycles of chemical treatment. Each cycle includes an ammonia treatment for a first duration and a hydrofluoric acid treatment for a second duration. The first duration is shorter than the second duration. In some instances, the first duration is about one half (½) of the second duration to ensure satisfactory chemical treatment of the second dielectric layer 222. The treatment cycle may be repeated between 2 times and 6 times. The example selective etching process is configured to selectively etch the second dielectric layer 222 while maintaining a substantially flat bottom profile. As shown in FIG. 9, because the etching process at block 114 is highly selective to the second dielectric layer 222, the top channel layer 208T, the cladding layer 218, and the first dielectric 220 are substantially unetched. At conclusion of operations at block 114, helmet recesses 221 are formed.

Figure 10:
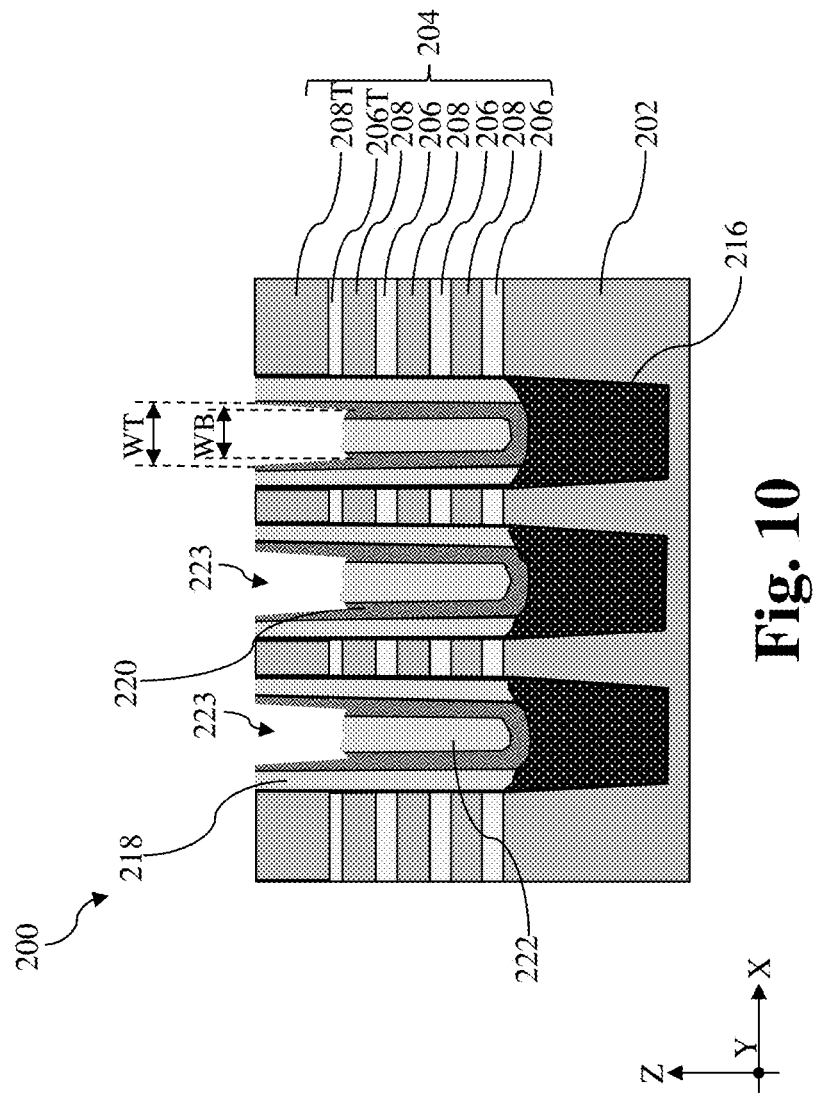

Referring to FIGS. 1 and 10, method 100 includes a block 116 where the first dielectric layer 220 is trimmed to widen the helmet recesses 221, thereby forming widened helmet recesses 223. The trimming process at block 116 is selective to the first dielectric layer 220, which is formed of an oxidizable dielectric material, such as silicon carbonitride in the depicted embodiment. In some embodiments, the selective trimming process at block 116 may be divided into a chemical treatment step and a flushing step. The chemical treatment step may include use of an oxidizer that oxidizes the first dielectric layer 220 but not the second dielectric layer 222. The flushing step may include use of an acid to remove products of the chemical treatment step. For example, at block 116, the workpiece 200, including the first dielectric layer 220, may be chemically treated with high temperature sulfuric peroxide mixture (HTSPM) in the chemical treatment step and the workpiece 200 is subject to a flushing step that implements dilute hydrofluoric acid (dHF). The high temperature sulfuric peroxide mixture may oxidize the first dielectric layer 220 and the dilute hydrofluoric acid may remove the oxide. It noted that the trimming process at block 116 may also etch the second dielectric layer 222, the cladding layer 218 and the top channel layer 208T, albeit at lower rates. In some implementations, the chemical treatment step may be performed for a third duration and the flushing step may be performed for a fourth duration shorter than the third duration. In some instances, the third duration is about 10 to 15 times of the second fourth to ensure selective trimming of the first dielectric layer 220 and minimize etching of the second dielectric layer 222. As shown in FIG. 10, because the trimming process at block 116 is selective to the first dielectric layer 220, the helmet recesses 221 are widened to form the widened helmet recesses 223. In some embodiments represented in FIG. 10, each of the widened helmet recesses 223 includes a bottom width (WB) and a top width (WT) greater than the bottom width (WB). As a result, each of the widened helmet recesses 223 includes a tapered profile that tapers downward along the Z direction. In some instances, the bottom width (WB) is between about 10 nm and about 15 nm and the top width (WT) is between about 16 nm and about 20 nm. In other words, due to the trimming at block 116, a ratio of the top width (WT) to the bottom width (WB) may be between about 1.1 and 1.6. When this width ratio is smaller than 1.1, the benefits of the additional trimming operation are outweighed by its cost. When this width ratio is greater than 1.6, the helmet feature that fills the widened helmet recess 223 may overhang too much to hinder the channel release process or the gate formation process. In some embodiments, a cleaning process may be performed after the trimming process. The cleaning process may include use of high temperature sulfuric peroxide mixture (HTSPM).

Reference is still made to FIG. 10. The widened helmet recesses 223 may partially extend downward into the first dielectric layer 220 and the second dielectric layer 222. Because the trimming process at block 116 is selective to the first dielectric layer 220, it is observed that the widened helmet recesses 223 extend more into the first dielectric layer 220 than into the second dielectric layer 222.

Figure 11:
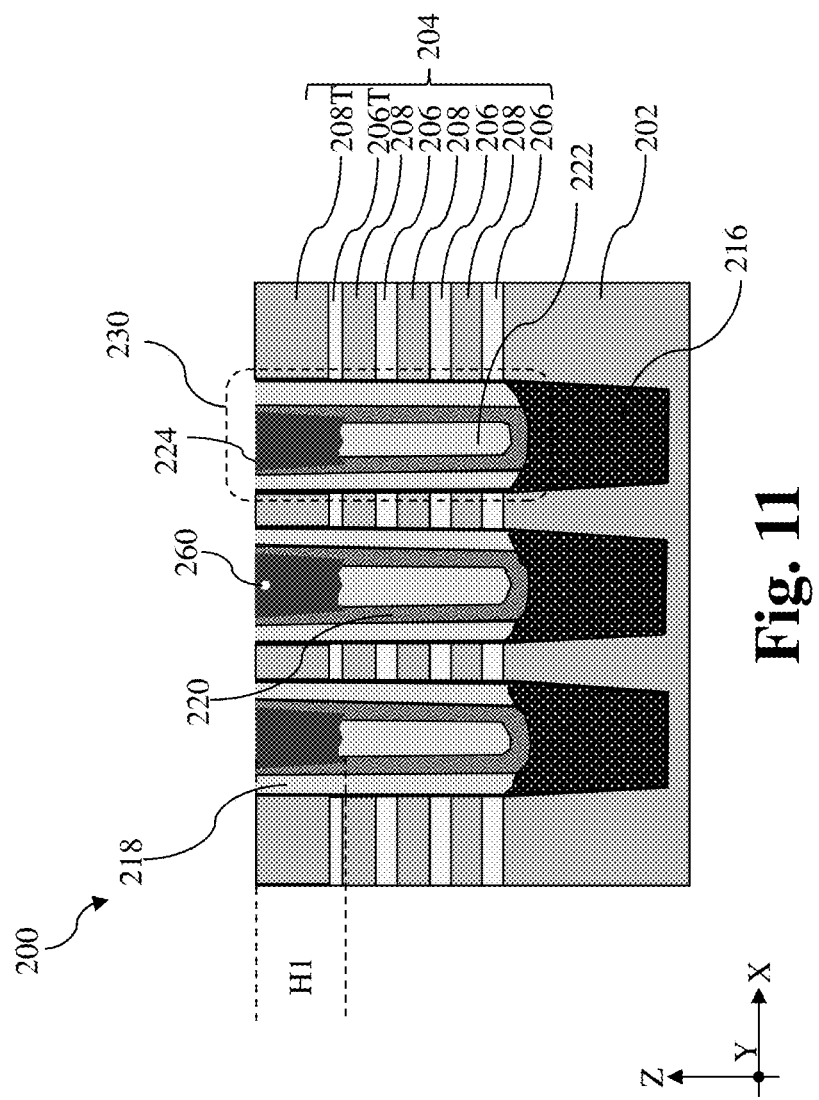

Referring to FIGS. 1 and 11, method 100 includes a block 118 where helmet features 224 are formed in the widened helmet recesses 223. The helmet features 224 may include aluminum oxide, aluminum nitride, aluminum oxynitride, zirconium oxide, zirconium nitride, zirconium aluminum oxide, hafnium oxide, or a suitable dielectric material. The material of the helmet feature 224 is selected such that it can endure an anisotropic dry etch process better than the other exposed features and layers. Most notably, a dielectric constant of the helmet features 224 is greater than that of the second dielectric layer 222. In an example process, a dielectric material for the helmet features 224 is deposited over the workpiece 200 using ALD or CVD and then the workpiece 200 is then planarized using a CMP process to remove excess the dielectric material on the cladding layer 218, thereby forming the helmet features 224 shown in FIG. 11. The helmet features 224 track the shapes of the widened helmet recesses 223. At conclusion of the operations at block 118, dielectric fins 230 are formed. Each of the dielectric fins 230 includes the first dielectric layer 220, the second dielectric layer 222, and the helmet feature 224. The first dielectric layer 220 and the second dielectric layer 222 constitute a base feature of the dielectric fin 230 and the helmet feature 224 caps the base feature from the top. While the widened helmet recesses 223 facilitate the formation of the helmet features 224, small and non-elongated void 260 may still be present near top surfaces of the helmet features 224. As will be described below, the void 260 is likely to be removed by subsequent etching or planarization process, leaving behind substantially void-free, seam-free helmet features 224. Upon conclusion of the planarization process, a first height H1 of the helmet features 224 may be between 20 nm and about 40 nm.

Figure 12:
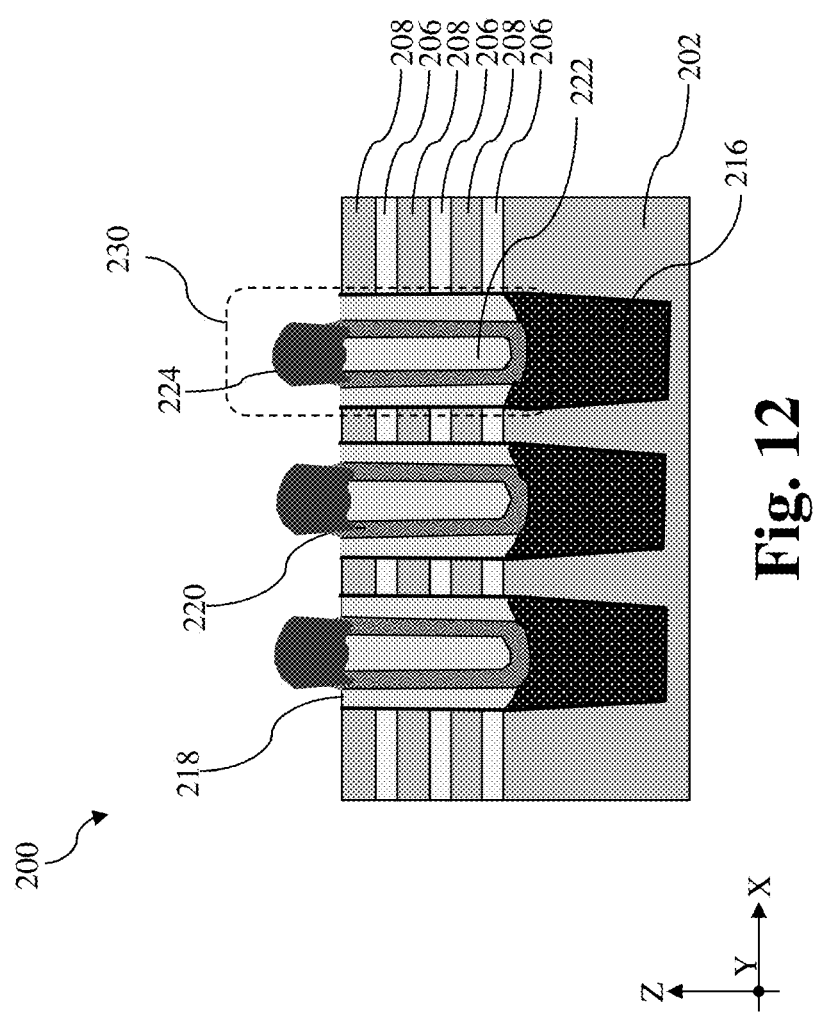

Referring to FIGS. 1 and 12, method 100 includes a block 120 where the top channel layer 208T, the top sacrificial layer 206T and a top portion of the cladding layer 218 are recessed. In an example process, the workpiece 200 is anisotropically etched to selectively remove a top portion of the cladding layer 218, a top portion of the semiconductor liner 214, the top channel layer 208T, and the top sacrificial layer 206T expose the channel layer 208. The anisotropic etch at block 120 may be a dry etch process that includes hydrogen, a fluorine-containing gas (e.g., $CF_4$, $NF_3$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. It is noted that the anisotropic etch at block 120 is mask-less and is self-aligned because the anisotropic etch etches the helmet features 224 at a much slower rate. That said, the anisotropic etch may substantially reduce the height of the helmet features 224 and round the top surfaces of the helmet features 224, as shown in FIG. 12. At this stage, the void 260 is either removed or becomes partially exposed (not explicitly shown). It is also noted that lower portions of the sidewalls of the helmet features 224 may be covered by the first dielectric layer 220. The greater top width WT of the helmet features 224 helps the helmet features 224 withstand etching at block 120. With the tapered profile, too much of the helmet features 224 may be consumed at block 120, leading to merging of source/drain features 240 (to be described below) at block 124.

Figure 13:
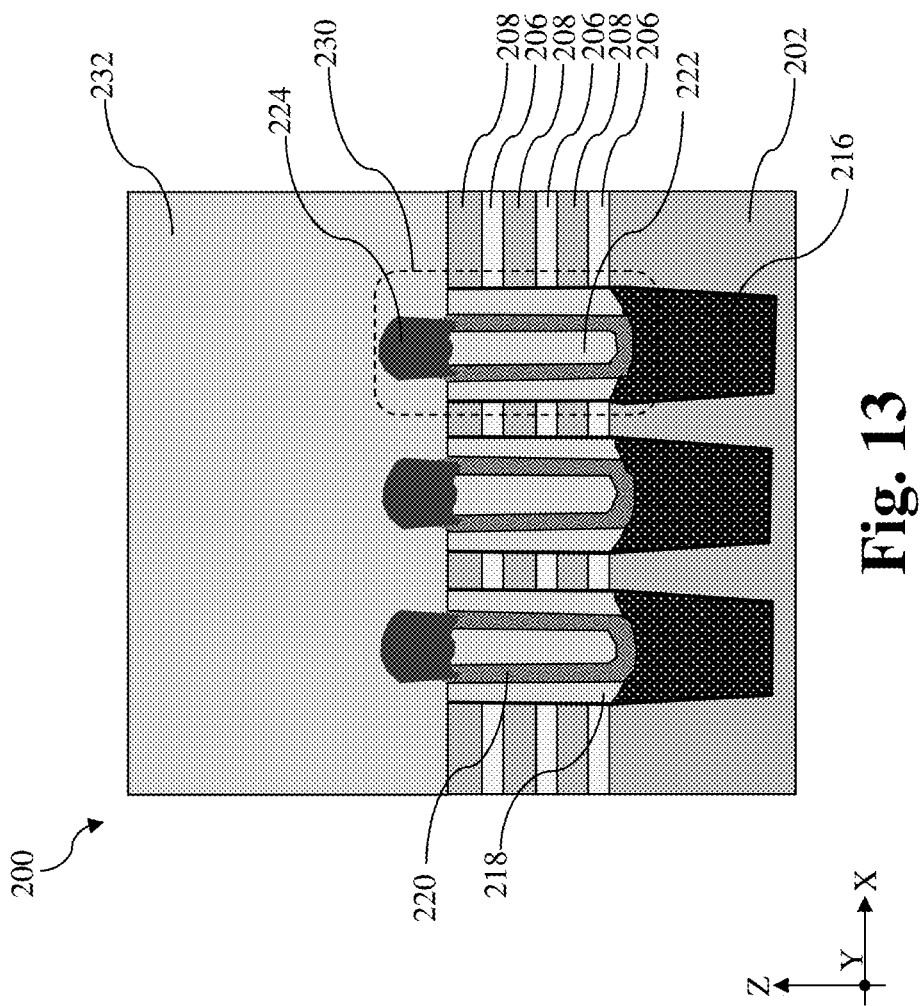
Figure 14:
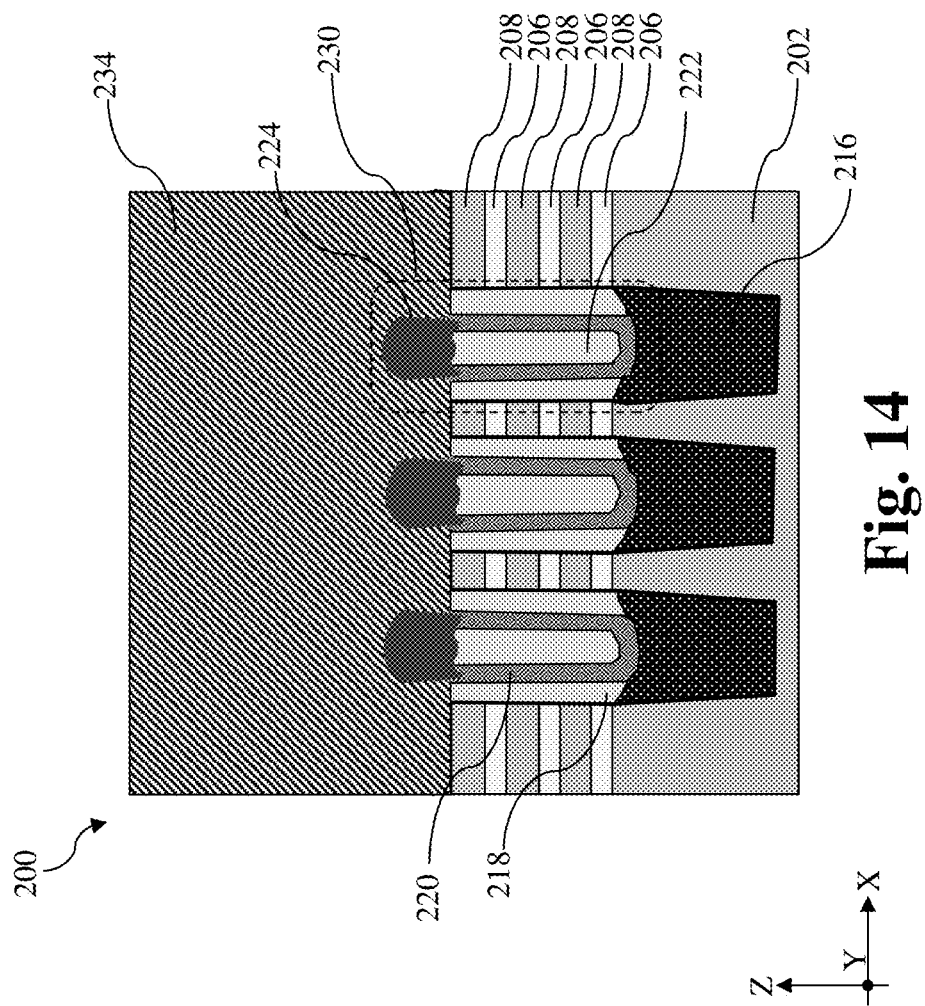

Referring to FIGS. 1, 13 and 14, method 100 includes a block 122 where a dummy gate stack 232 is formed over the fin-shaped structures 212. In some embodiments, a gate replacement process (or gate-last process) is adopted where the dummy gate stack 232 serves as a placeholder for a functional gate structure. Other processes and configuration are possible. Although not explicitly shown in FIG. 13, the dummy gate stack 232 includes a dummy dielectric layer and a dummy electrode disposed over the dummy dielectric layer. The regions of the fin-shaped structures 212 underlying the dummy gate stack 232 may be referred to as channel regions. Each of the channel regions in a fin-shaped structure 212 is sandwiched along the Y direction between two source/drain regions for source/drain formation. In an example process, the dummy dielectric layer is blanketly deposited over the workpiece 200 by CVD. A material layer for the dummy electrode is then blanketly deposited over the dummy dielectric layer. The dummy dielectric layer and the material layer for the dummy electrode are then patterned using photolithography processes to form the dummy gate stack 232. In some embodiments, the dummy dielectric layer may include silicon oxide and the dummy electrode may include polycrystalline silicon (polysilicon). As shown in FIG. 13, the dummy gate stack 232 is disposed over the helmet features 224 and comes in contact with sidewalls and top surfaces of the helmet features 224.

Reference is now made to FIG. 14. at least one gate spacer 234 is formed along sidewalls of the dummy gate stacks 232. The at least one gate spacer 234 may include two or more gate spacer layers. Dielectric materials for the at least one gate spacer 234 may be selected to allow selective removal of the dummy gate stack 232. Suitable dielectric materials for the at least one gate spacer 234 may include silicon nitride, silicon oxycarbonitride, silicon carbonitride, silicon oxide, silicon oxycarbide, silicon carbide, silicon oxynitride, and/or combinations thereof. In an example process, the at least one gate spacer 234 may be conformally deposited over the workpiece 200 using CVD, subatmospheric CVD (SACVD), or ALD.

Figure 15:
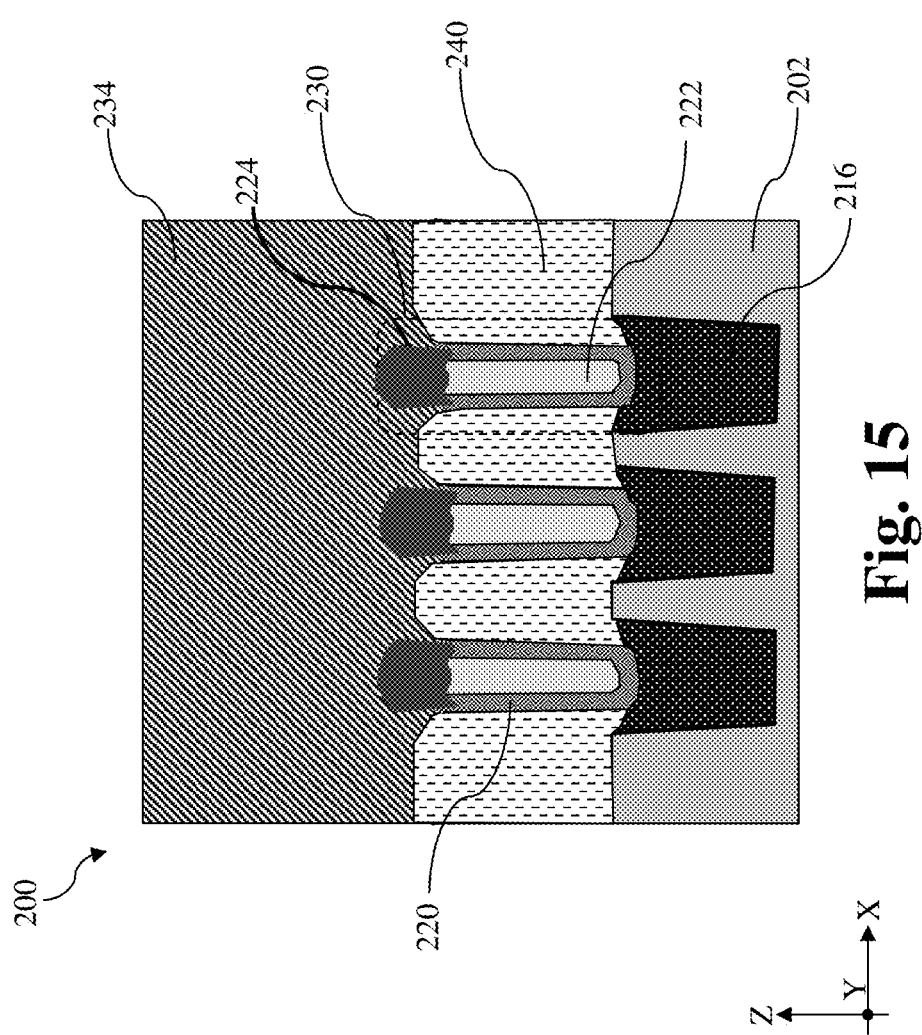

Referring to FIGS. 1 and 15, method 100 includes a block 124 where source/drain features 240 are formed. Operations at block 124 include recessing of the source/drain regions of the fin-shaped structures 212 to form source/drain recesses, formation of inner spacer features, and deposition of source/drain features 240 in the source/drain recesses. With the dummy gate stack 232 and the at least one gate spacer 234 serving as an etch mask, the workpiece 200 is anisotropically etched to form the source/drain recesses (not explicitly shown, filled with the source/drain features 240 in FIG. 15) over the source/drain regions of the fin-shaped structures 212. The anisotropic etch at block 120 may include a dry etch process or a suitable etch process. For example, the dry etch process may implement an oxygen-containing gas, hydrogen, a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The dry etch process at block 124 may etch the at least one gate spacer 234, the helmet features 224, and the first dielectric layer 220 at a slower rate and leave dielectric fins substantially unetched. Sidewalls of the plurality of channel layers 208, the plurality of the sacrificial layers 206, and the cladding layer 218 are exposed in the source/drain recess.

Although not specifically shown in figures, operations at block 124 also include formation of inner spacer features to interleave the channel layers 208. After the formation of the source/drain recesses, the sacrificial layers 206 exposed in the source/drain recesses are first selectively and partially recessed to form inner spacer recesses, while the exposed channel layers 208 are substantially unetched. Because the cladding layer 218 and the sacrificial layers 206 share a similar composition (i.e., SiGe), the cladding layer 218 is also etched at block 124. In an embodiment where the channel layers 208 consist essentially of silicon (Si), sacrificial layers 206 consist essentially of silicon germanium (SiGe), and the cladding layer 218 consists essentially of silicon germanium (SiGe), the selective and partial recess of the sacrificial layers 206 and the cladding layer 218 may include APM etch (e.g., ammonia hydroxide-hydrogen peroxide-water mixture). After the formation of the inner spacer recesses, an inner spacer material layer is then conformally deposited using CVD or ALD over the workpiece 200, including over and into the inner spacer recesses and the space left behind by the removed portion of the cladding layer 218. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features.

Operations at block 124 also includes deposition of source/drain features 240 in the source/drain recesses. In some embodiments, the source/drain features 240 may be selectively and epitaxially deposited on the exposed semiconductor surfaces of the channel layers 208 and the substrate 202. The source/drain features 240 may be deposited using an epitaxial process, such as vapor-phase epitaxy (VPE), ultra-high vacuum CVD (UHV-CVD), molecular beam epitaxy (MBE), and/or other suitable processes. The source/drain features 240 may be either n-type or p-type. When the source/drain features 240 are n-type, it may include silicon (Si) and may be doped with an n-type dopant, such as phosphorus (P) or arsenic (As). When the source/drain features 240 are p-type, it may include silicon germanium (SiGe) or germanium (Ge) and may be doped with a p-type dopant, such as boron (B) or boron difluoride ($BF_2$). Doping of the source/drain features 240 may be performed either in situ with their deposition or ex situ using an implantation process, such as a junction implant process. While not explicitly shown in the figures, the source/drain features 240 may include multiple epitaxial layers with different doping concentrations. As shown in FIG. 15, the dielectric fins 230 serves as dividers of source/drain features in adjacent source/drain recesses. When the dielectric fins 230 are not formed or are not tall or wide enough, adjacent source/drain features 240 may merge, causing undesirable shorts.

Referring to FIG. 1, method 100 includes a block 126 where the dummy gate stack 232 are removed. Operations at block 126 include deposition of a contact etch stop layer (CESL) and an interlayer dielectric (ILD) layer and removal of the dummy gate stack 232. Although not explicitly show, the CESL and ILD are deposited over the source/drain features 240 to protect the same from subsequent processes. The CESL may include silicon nitride and may be deposited on the source/drain features 240 using ALD or CVD. The ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited on the CESL by spin-on coating, an FCVD process, or other suitable deposition technique. After the deposition of the CESL and the ILD layer, a planarization process (such a chemical mechanical polishing (CMP) process) may be performed to the workpiece 200 to provide a planar top surface that exposes the dummy gate stack 232.

The exposed dummy gate stack 232 is then removed from the workpiece 200 by a selective etch process. The selective etch process may be a selective wet etch process, a selective dry etch process, or a combination thereof. In the depicted embodiments, the selective etch process selectively removes the dummy dielectric layer and the dummy electrode without substantially damaging the helmet features 224, the at least one gate spacer 234 and the first dielectric layer 220. The removal of the dummy gate stack 232 results in a gate trenche over the channel regions. The gate trenches are defined by the at least one gate spacer 234.

Figure 16:
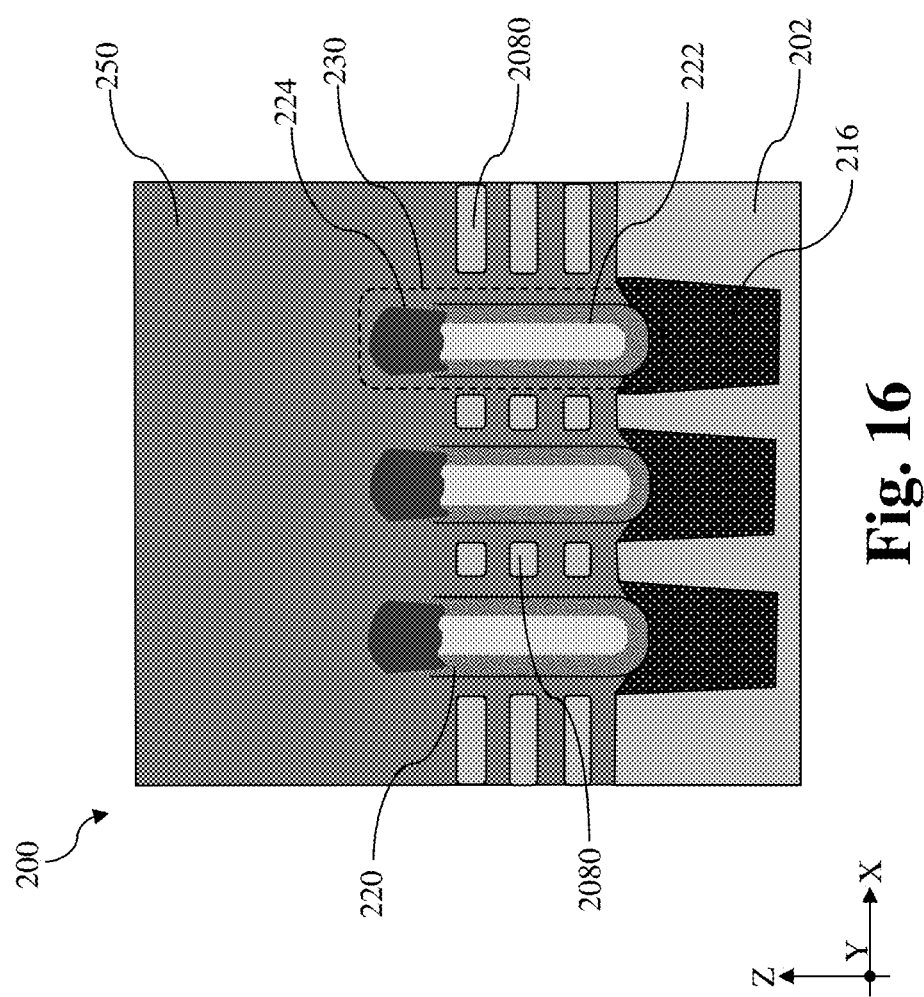

Referring to FIGS. 1 and 16, method 100 includes a block 128 where the sacrificial layers 206 in the channel region are removed to release channel members 2080. After the removal of the dummy gate stack 232, channel layers 208, sacrificial layers 206, and the cladding layer 218 in the channel region are exposed in the gate trenches. Due to their similar composition, the exposed sacrificial layers 206 between the channel layers 208 and the cladding layer 218 may be selectively removed to release the channel layers 208 to form channel members 2080, shown in FIG. 16. The channel members 2080 are vertically stacked along the Z direction. The selective removal of the sacrificial layers 206 and the cladding layer 218 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. With the removal of the sacrificial layers 206 and the cladding layer 218 in the channel region, the first dielectric layer 220, the channel members 2080, the top surface of the base portion 212B, and the isolation feature 216 are exposed in the gate trenches. The tapered profile of the helmet feature 224 ensures that the helmet feature 224 and the adjacent channel layer 208 do not pinch off or restrict the access to lower sacrificial layer 206.

Figure 17:
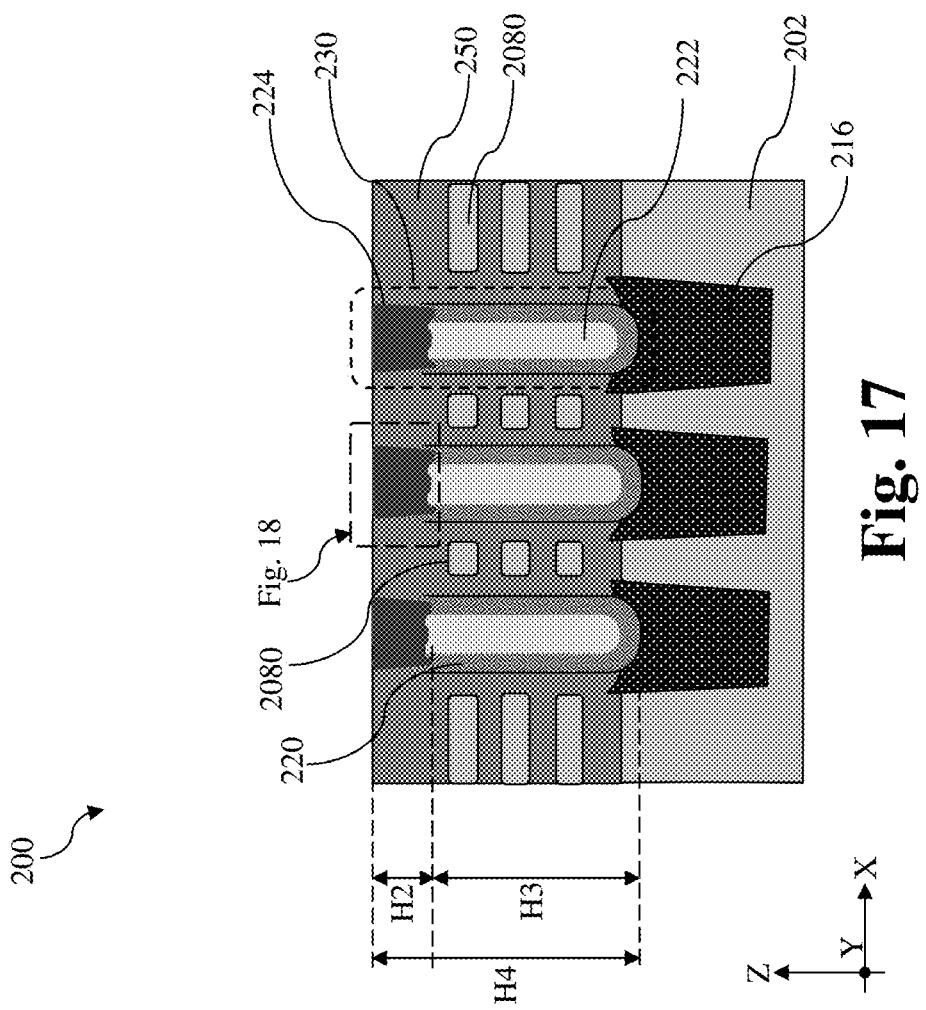

Referring to FIGS. 1, 16 and 17, method 100 includes a block 130 where a gate structure 250 is formed to wrap around each of the channel members 2080. The gate structure layers may include an interfacial layer on the channel members 2080 and the substrate 202, a gate dielectric layer over the interfacial layer, and a gate electrode layer over the gate dielectric layer. In some embodiments, the interfacial layer includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the substrate 202 to form the interfacial layer. The gate dielectric layer is then deposited over the interfacial layer using ALD, CVD, and/or other suitable methods. The gate dielectric layer may include high-K dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. After the formation or deposition of the interfacial layer and the gate dielectric layer, a gate electrode layer is deposited over the gate dielectric layer. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. The tapered profile of the helmet feature 224 ensures that the helmet feature 224 and the adjacent channel layer 208 do not pinch off or restrict the access to lower channel members 2080.

In various embodiments, a planarization process, such as a CMP process, may be performed to remove excessive materials to provide a substantially planar top surface of the gate structures. Referring to FIG. 17, the deposited gate structure 250 layers wrap around each of the channel members 2080 and come in contact with the dielectric fins 230. More specifically, the gate structure 250 directly contact the first dielectric layer 220 and the helmet features 224. The second dielectric layer 222 is spaced apart from the gate structure 250 by the first dielectric layer 220. Referring to FIG. 17, after the formation of the gate structure 250, the workpiece 200 is planarized until the gate structure 250 is divided by the dielectric fins into segments. Each of the dielectric fins 230 includes the first dielectric layer 220 and the second dielectric layer 222 as a bottom portion and the helmet feature 224 as a top portion. As shown in FIG. 17, the helmet feature 224 includes a second height H2, the bottom portion includes a third height H3, and the entire dielectric fin 230 includes a fourth height H4. In some instances, the second height H2 may be between about 10 nm and 30 nm, the third height H3 may be between about 30 nm and about 70 nm, and the fourth height H4 may be between about 40 nm and about 100 nm. A ratio of the second height H2 to the third height H3 may be between about 0.3 and about 1. This ratio is not trivial because it ensures that helmet features 224 have sufficient thickness to withstand the etching processes but do not come directly between two adjacent source/drain features 240.

Figure 18:
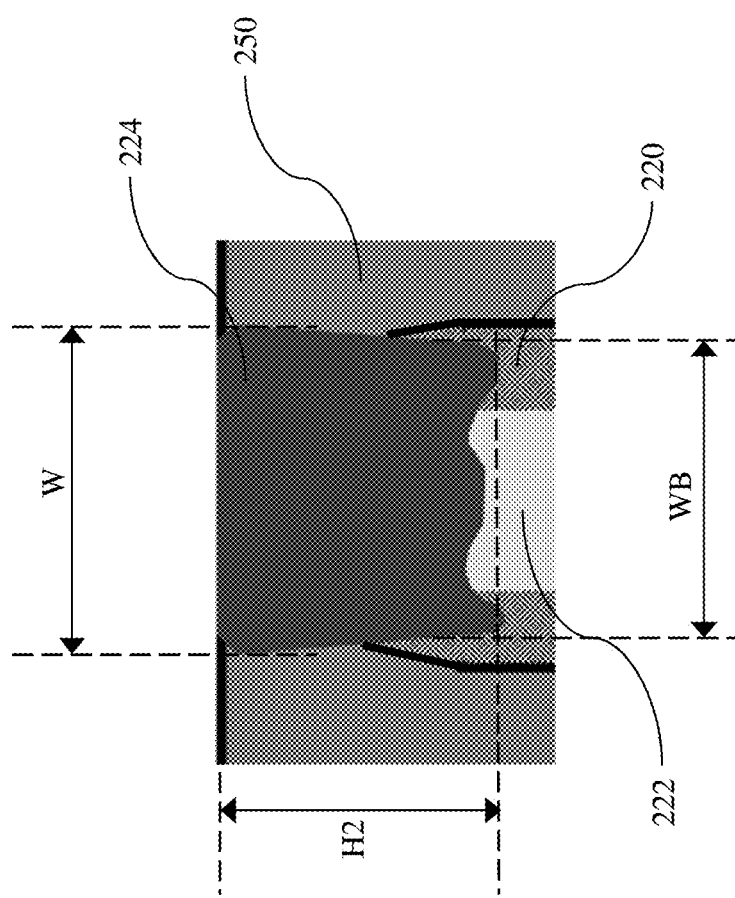
FIG. 18 illustrates an enlarged fragmentary cross-sectional view of a helmet feature, according to one or more aspects of the present disclosure.

Reference is now made to FIG. 18, which is an enlarged fragmentary cross-sectional view of a helmet feature 224 in FIG. 17. Due to the etching process at block 120 and planarization at block 130, the helmet feature 224 in FIG. 18 includes the bottom width WB and a final top width W greater than the bottom width WB, where the final top width W is smaller than the top width WT. As a result, the helmet feature 224 still has a tapered profile. The bottom width WB is between about 10 nm and about 15 nm while the final top width W is between about 15.5 and 18 nm. The helmet feature 224 in FIG. 18 also has a second height H2 smaller than the first height H1. As described above, the second height H2 may be between about 10 nm and about 30 nm. The helmet feature 224 extends partially into the first dielectric layer 220 and the second dielectric layer 222 along the Z direction. Because of the trimming process at block 116, the helmet feature 224 extends further into the first dielectric layer 220 than into the second dielectric layer 222. The second dielectric layer 222 has a lower dielectric constant than the first dielectric layer 220 and serves to reduce the parasitic capacitance. The helmet feature 224 is formed of metal oxide and may have a dielectric constant even greater than that of the first dielectric layer 220. Due to the implementation of the process of the present disclosure, the helmet feature 224 does not overly extend into the second dielectric layer 222, thereby preventing undesirable increase of parasitic capacitance. After the CMP at block 130, the void 260 may be removed. The taper profile of the widened helmet recess 223 prevents formation of an elongated seam-like void. The elongated seam-like void may compromise the integrity of the helmet feature 224 during various etching or planarization processes.

Based on the above discussions, it can be seen that the present disclosure offers advantages over conventional processes. It is understood, however, that other embodiments may offer additional advantages, and not all advantages are necessarily disclosed herein, and that no particular advantage is required for all embodiments. For example, the processes disclosed in the present disclosure form widened helmet recesses and helmet features that taper downward. The wider top width of the helmet features facilitates patterning of source/drain features and the narrow bottom width enlarges process windows for channel release and gate formation. Additionally, the taper profile prevents formation of seam-like voids in the helmet features.

In one exemplary aspect, the present disclosure is directed to a method. The method includes forming a stack of epitaxial layers over a substrate, forming a first fin-like structure and a second fin-like structure from the stack and a portion of the substrate, forming an isolation feature between the first fin-like structure and the second fin-like structure, forming a cladding layer over the first fin-like structure and the second fin-like structure, conformally depositing a first dielectric layer over the cladding layer, depositing a second dielectric layer over the first dielectric layer, planarizing the first dielectric layer and the second dielectric layer until the cladding layer are exposed, performing an etch process to etch the second dielectric layer to form a helmet recess, performing a trimming process to trim the first dielectric layer to widen the helmet recess, and depositing a helmet feature in the widened helmet recess.

In some embodiments, the cladding layer includes silicon germanium, the first dielectric layer includes silicon carbonitride, silicon carbide, or silicon nitride, and the second dielectric layer includes silicon oxide. In some instances, the etch process includes a plurality cycles of chemical oxide removal. In some embodiments, the etch process includes use of ammonia and hydrofluoric acid. In some embodiments, the trimming process includes a chemical treatment step comprising use of an oxidizer, and a flushing step comprising use of an acid. In some implementations, the oxidizer includes a high temperature sulfuric peroxide mixture and the acid includes dilute hydrofluoric acid. In some instances, the chemical treatment step lasts a first duration, the flushing step lasts a second duration shorter than the first duration, and a ratio of the first duration and the second duration is between about 10 and 15. In some embodiments, the method may further include after the trimming process, performing a cleaning process. The cleaning process includes use of a high temperature sulfuric peroxide mixture.

In another exemplary aspect, the present disclosure is directed to a method. The method includes receiving a workpiece that includes a first fin-like structure and a second fin-like structure disposed over a substrate, an isolation feature between the first fin-like structure and the second fin-like structure, a cladding layer disposed over the isolation feature and extending along sidewalls of the first fin-like structure and the second fin-like structure, a conformal dielectric layer in contact with the cladding layer and the isolation feature, and a filler dielectric layer over the conformal dielectric layer and spaced apart from the first fin-like structure, the second fin-like structure and the isolation feature by the conformal dielectric layer. The method further includes performing a etch process to etch the filler dielectric layer to form a helmet recess, performing a trimming process to trim the conformal dielectric layer to widen the helmet recess, and depositing a helmet feature in the widened helmet recess.

In some embodiments, before the etch process, top surfaces of the first fin-like structure, the second fin-like structure, the cladding layer, the conformal dielectric layer, and the filler dielectric layer are coplanar. In some embodiments, the filler dielectric layer includes silicon oxide and the conformal dielectric layer is substantially free of oxygen. In some instances, the conformal dielectric layer includes silicon carbonitride. In some implementations, the helmet feature includes aluminum oxide, hafnium oxide, zirconium oxide, or zinc oxide. In some embodiments, the widened helmet recess includes a bottom width and a top width greater than the bottom width such that the widened helmet recess includes a tapered profile.

In yet another exemplary aspect, the present disclosure is directed to a semiconductor structure. The semiconductor structure includes a first dielectric fin and a second dielectric fin, a plurality of channel members disposed between the first dielectric fin and the second dielectric fin, and a gate structure disposed between the first dielectric fin and the second dielectric fin and wrapping around each of the plurality of channel members. Each of the first dielectric fin and the second dielectric fin includes a base feature and a helmet feature over the base feature. The helmet feature includes a bottom width and a top width greater than the bottom width such that the helmet feature includes a tapered profile.

In some embodiments, the bottom width is between about 10 nm and about 15 nm and the top width is between about 15.5 nm and about 18 nm. In some embodiments, the base feature includes an outer layer in contact with the gate structure and an inner layer spaced apart from the gate structure by the outer layer and the helmet feature partially extends into the outer layer by a first depth and partially extends into the inner layer by a second depth smaller than the first depth. In some implementations, the inner layer includes silicon oxide and the outer layer is substantially free of oxygen. In some instances, the outer layer includes silicon carbonitride.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a first dielectric fin and a second dielectric fin;
a plurality of channel members disposed between the first dielectric fin and the second dielectric fin; and
a gate structure disposed between the first dielectric fin and the second dielectric fin and wrapping around each of the plurality of channel members,
wherein each of the first dielectric fin and the second dielectric fin comprises a base feature and a helmet feature over the base feature, wherein the helmet feature comprises a bottom width and a top width greater than the bottom width such that the helmet feature comprises a tapered profile.

2. The semiconductor structure of claim 1, wherein a ratio of the top width to the bottom width is between about 1.1 and about 1.6.

3. The semiconductor structure of claim 1,
wherein the bottom width is between about 10 nm and about 15 nm,
wherein the top width is between about 15.5 nm and about 18 nm.

4. The semiconductor structure of claim 1,
wherein the base feature comprises an outer layer in contact with the gate structure and an inner layer spaced apart from the gate structure by the outer layer,
wherein the helmet feature partially extends into the outer layer by a first depth and partially extends into the inner layer by a second depth smaller than the first depth.

5. The semiconductor structure of claim 4, wherein the inner layer comprises silicon oxide and the outer layer is substantially free of oxygen.

6. The semiconductor structure of claim 4, wherein the outer layer comprises silicon carbonitride.

7. The semiconductor structure of claim 1, wherein the helmet feature comprises aluminum oxide, aluminum nitride, aluminum oxynitride, zirconium oxide, zirconium nitride, zirconium aluminum oxide, or hafnium oxide.

8. The semiconductor structure of claim 1,
wherein the first dielectric fin is disposed over a first isolation feature,
wherein the second dielectric fin is disposed over a second isolation feature,
wherein the plurality of channel members are disposed over a base portion,
wherein the base portion is sandwiched between the first isolation feature and the second isolation feature.

9. The semiconductor structure of claim 8,
wherein the base feature of the first dielectric fin comprises a first height measured from a top surface of the first isolation feature,
wherein the helmet feature of the first dielectric fin comprises a second height measured from a top surface of the helmet feature,
wherein the first height is greater than the second height.

10. The semiconductor structure of claim 9, wherein a ratio of the second height to the first height is between about 0.3 and 1.

11. A semiconductor structure, comprising:
a first semiconductor base portion;
a first plurality of nanostructures disposed over the first semiconductor base portion;
a first gate segment disposed over the first semiconductor base portion and wrapping around each of the first plurality of nanostructures;
a second semiconductor base portion;
a second plurality of nanostructures disposed over the second semiconductor base portion;
a second gate segment disposed over the second semiconductor base portion and wrapping around each of the second plurality of nanostructures; and
a dielectric fin sandwiched between the first gate segment and the second gate segment,
wherein the dielectric fin comprises a base feature and a helmet feature over the base feature,
wherein the helmet feature comprises a bottom width and a top width greater than the bottom width such that the helmet feature comprises a tapered profile.

12. The semiconductor structure of claim 11, wherein top surfaces of the helmet feature, the first gate segment and the second gate segment are coplanar.

13. The semiconductor structure of claim 11,
wherein the base feature comprises an outer layer in contact with the first gate segment and the second gate segment and an inner layer spaced apart from the first gate segment and the second gate segment by the outer layer,
wherein the helmet feature partially extends into the outer layer by a first depth and partially extends into the inner layer by a second depth smaller than the first depth.

14. The semiconductor structure of claim 13, wherein the inner layer comprises silicon oxide and the outer layer is substantially free of oxygen.

15. The semiconductor structure of claim 13, wherein the outer layer comprises silicon carbonitride.

16. The semiconductor structure of claim 11, wherein the helmet feature comprises aluminum oxide, aluminum nitride, aluminum oxynitride, zirconium oxide, zirconium nitride, zirconium aluminum oxide, or hafnium oxide.

17. The semiconductor structure of claim 11, further comprising:
an isolation feature sandwiched between the first semiconductor base portion and the second semiconductor base portion.

18. A semiconductor structure, comprising:
a first plurality of nanostructures;
a first gate segment wrapping around each of the first plurality of nanostructures;
a second plurality of nanostructures;
a second gate segment wrapping around each of the second plurality of nanostructures; and
a dielectric fin sandwiched between the first gate segment and the second gate segment,
wherein top surfaces of the first gate segment, the second gate segment and the dielectric fin are coplanar,
wherein the dielectric fin comprises a base feature and a helmet feature over the base feature,
wherein a composition of the dielectric fin is different a composition of the helmet feature,
wherein the helmet feature comprises a bottom width and a top width greater than the bottom width such that the helmet feature comprises a tapered profile.

19. The semiconductor structure of claim 18,
wherein the base feature comprises an outer layer in contact with the first gate segment and the second gate segment and an inner layer spaced apart from the first gate segment and the second gate segment by the outer layer,
wherein the helmet feature partially extends into the outer layer by a first depth and partially extends into the inner layer by a second depth smaller than the first depth.

20. The semiconductor structure of claim 19,
wherein the inner layer comprises silicon oxide,
wherein the outer layer comprises silicon carbonitride,
wherein the helmet feature comprises aluminum oxide, aluminum nitride, aluminum oxynitride, zirconium oxide, zirconium nitride, zirconium aluminum oxide, or hafnium oxide.

* * * * *